United States Patent
Sakai et al.

[11] Patent Number: 6,053,667
[45] Date of Patent: Apr. 25, 2000

[54] CARRYING APPARATUS FOR SPHERICAL OBJECTS

[75] Inventors: Nobuo Sakai; Migaku Ishida, both of Fukuoka, Japan

[73] Assignee: Mitsui High-Tec Inc., Fukuoka, Japan

[21] Appl. No.: 09/102,678

[22] Filed: Jun. 23, 1998

[30] Foreign Application Priority Data

Dec. 12, 1997 [JP] Japan .................................. 9-343485

[51] Int. Cl.⁷ ........................... B65G 53/08; B65G 53/52
[52] U.S. Cl. ................................ 406/56; 406/61; 406/68; 406/92
[58] Field of Search ............................. 406/68, 61, 92, 406/56

[56] References Cited

U.S. PATENT DOCUMENTS

| | | | |
|---|---|---|---|
| 3,301,606 | 1/1967 | Bruno | 302/58 X |
| 3,312,507 | 4/1967 | Oehlrich et al. | 302/66 X |
| 3,313,577 | 4/1967 | Wolfe | 302/64 X |
| 5,129,930 | 7/1992 | Gauthier et al. | 55/394 X |

FOREIGN PATENT DOCUMENTS

| | | | |
|---|---|---|---|
| 2843864 | 3/1980 | Germany | 406/92 |
| 0222927 | 9/1987 | Japan | 406/92 |

*Primary Examiner*—Christopher P. Ellis
*Assistant Examiner*—Kenneth W Bower
*Attorney, Agent, or Firm*—Greenblum & Bernstein, P.L.C.

[57] ABSTRACT

It is an object of the present invention to provide a novel carrying apparatus for carrying spherical objects such as spherical semiconductors of silicon in which the spherical objects are not contacted with an inner surface of a pipe-shaped body while they are being carried in the pipe-shaped body. The carrying apparatus for carrying spherical objects is provided with a spiral current generating means for generating a spiral current of fluid, and the spiral current generated by the spiral current generating means is introduced into a passage of the spherical objects. The spiral current generating means includes a rotary shaft 3 in which a carrying passage 2 is formed in a direction of the central axis and a spiral groove 3b is formed at a predetermined position on the outer circumferential surface. Further, in the rotary shaft 3, a jet pipe 3a connecting the carrying passage 2 with the spiral groove 3b is formed.

12 Claims, 5 Drawing Sheets

CARRYING APPARATUS FOR SPHERICAL OBJECTS

BACKGROUND OF THE INVENTION

1. Field of the Invention

The present invention relates to an apparatus for carrying spherical objects without contact to the apparatus between the processes for manufacturing spherical semiconductor devices

2. Description of the Related Art

Conventionally, when a semiconductor device is made, a circuit pattern is formed on a silicon wafer, and it is diced in accordance with the necessity so as to form a semiconductor chip. Recently, in the above circumstances, there is proposed a technique in which a circuit pattern is formed on a spherical semiconductor (ball semiconductor) made of single crystal silicon, the diameter of which is not more than 1 mm.

For example, in order to make a discrete device, which is used for an MOS device, a solar battery or an optical sensor, of a spherical single crystal silicon, or in order to make a semiconductor integrated circuit of a spherical single crystal silicon, it is necessary to provide various processes such as a mirror polishing process, cleaning process, thin film forming process, resist coating process, photolithography process and etching process in which the spherical single crystal silicon is treated. In order to make the spherical semiconductor device effectively, it is necessary to connect the above treating and carrying processes with each other so that they can be formed into a line.

However, in the manufacturing processes, treatment is conducted not only in gas such as active gas or inert gas but also in liquid such as water or various solutions. In order to effectively manufacture and treat the spherical semiconductor devices, it is necessary to connect the manufacturing and treating processes with each other by pipe-shaped bodies such as pipes, and it is also necessary to carry the spherical silicon in the pipe-shaped bodies by a carrying force generated by fluid.

However, when the spherical objects are hydraulically carried as described above, the spherical silicon come into contact with an inner surface of the pipe. Therefore, a surface of the spherical silicon is worn out and further fine scratches are caused on the surface of the spherical silicon. Due to the foregoing, there is a possibility that the quality is deteriorated.

In order to solve the above problems, it is conceivable that the inner surface of a pipe, in which the spherical silicon pass through, is coated with a protective film so that the surface of the spherical silicon is not worn out. However, when the inner surface of the pipe is coated with the protective layer, the cost is raised and further it is difficult that the inner surface of the pipe is coated with the protective film of uniform thickness.

When surface treatment is conducted on a spherical single crystal silicon, or when a thin film is formed on the surface of a spherical single crystal silicon, or when photolithography is conducted, scratches caused on the surface could be a cause of pin holes in a thin film formed on the scratches, and further the pin holes could be a cause of leakage of an electrical current. Therefore, it is necessary to handle the spherical single crystal silicon very carefully.

When the spherical single crystal silicon comes into contact with the atmosphere, there is caused a problem of the formation of a natural oxide film or the pollution given to the spherical single crystal silicon. When the spherical semiconductor such as a spherical single crystal silicon is carried, it is preferable that the spherical semiconductor is carried in a closed space formed in a pipe-shaped body. Accordingly, when the spherical semiconductor is carried in the pipe-shaped body by a carrying force of fluid, it is necessary to provide a carrying apparatus in which the inner surface of the pipe-shaped body is not contacted with the spherical objects. However, such a apparatus has not been proposed up to this time.

SUMMARY OF THE INVENTION

It is an object of the present invention to provide a carrying apparatus for carrying spherical objects such as spherical single crystal silicon in which the spherical objects are not contacted with an inner surface of a pipe-shaped body while they are being carried in a pipe-shaped body.

The above object can be accomplished by a carrying apparatus for carrying spherical objects without contact including a spiral current generating means for generating a spiral current of fluid, wherein the spiral current generated by the spiral current generating means is introduced into a passage of the spherical objects.

The spiral current generating means includes a rotary shaft in which a carrying passage is formed in a direction of the central axis and a spiral groove is formed at a predetermined position on the outer circumferential surface. Further, in the rotary shaft, a jet pipe connecting the carrying passage with the spiral groove is formed.

A first aspect of the apparatus is an apparatus for carrying spherical objects of the present invention, which comprises:
  a carrying passage in which spherical objects are made to pass through; and
  a whirling current generating means for generating a spiral current of fluid in the carrying passage.

A second aspect of the apparatus is an apparatus according to the first aspect, wherein the spiral current generating means includes:
  a rotary shaft in which a carrying passage is formed in a direction of the central axis thereof and a spiral groove is formed at a predetermined position on the outer circumferential surface;
  a jet pipe formed in the rotary shaft, the jet pipe connecting the carrying passage with the spiral groove, and an outer pipe surrounding at least a part of said rotary shaft and extending to the lower current side than the rotary shaft so as to form a spiral passage between said outer pipe and the spiral groove,
  wherein by supplying spherical objects accompanied with carrier gas from upper current side of the carrying passage, a part of the carrier gas is passed through the jet pipe, the spiral passage to form a whirling current and the spherical objects is transferred out of the end of the outer pipe with the whirling current.

A third aspect of the apparatus is an apparatus according to the first aspect, wherein
  the rotary shaft has a straight portion whose outer diameter is constant, and tapered portion whose outer diameter is gradually contracted.

A fourth aspect of the apparatus is an apparatus according to the first aspect, wherein
  the jet pipe is formed in a direction making an acute angle with the central axis.

A fifth aspect of the apparatus is an apparatus according to the fourth aspect, wherein the angle θ is not more than 45°

A sixth aspect of the apparatus is an apparatus according to the fourth aspect, wherein the angle is not more than 30°.

A seventh aspect of the apparatus is an apparatus according to the first aspect, further comprising:

a rotor attached to the rotary shaft, and provided that a plurality of receiving recesses on an outer circumferential surface so that the rotor is driven by feeding a fluid to the receiving recesses.

An eighth aspect of the apparatus is an apparatus according to the seventh aspect, further comprising:

a rotation control means for controlling the rotating speed of the rotary shaft by controlling a quantity of fluid fed to the receiving recesses.

A ninth aspect of the apparatus is an apparatus according to the first aspect, further comprising:

a rotary transfer device in which a plurality of spherical object accommodating chambers are formed at regular intervals; and a supporting device for supporting the rotary transfer device, the supporting device having a receiving passage for receiving the spherical object which communicates with the accommodating chamber and also having a pickup passage, wherein the carrying passage is connected with the pickup passage for picking up the spherical object.

An tenth aspect of the apparatus is an apparatus according to the first aspect, wherein the spherical object is a spherical single crystal silicon.

An eleventh aspect of the apparatus is an apparatus according to the first aspect, wherein the spherical object is a spherical single crystal silicon covered with a gate oxide film.

A twelfth aspect of the apparatus is an apparatus according to the first aspect, wherein the carrier gas is an inert gas.

A thirteenth aspect of the apparatus is an apparatus according to the first aspect, wherein an inner diameter of the jet pipe is smaller than the outer diameter of the spherical object.

In this specification, terminology of "fluid" means not only gas such as active gas or inactive gas but also liquid such as water or various solutions. Terminology of "spherical object" means not only a spherical semiconductor such as spherical single crystal silicon or spherical gallium arsenide(GaAs) but also spherical objects of various materials.

DESCRIPTION OF THE PREFERRED EMBODIMENT

An embodiment of the present invention will be specifically explained below referring to an example in which the present invention is applied to the carrying of a spherical semiconductor device. However, it should be noted that the present invention is not limited to the specific example.

Figure 1:
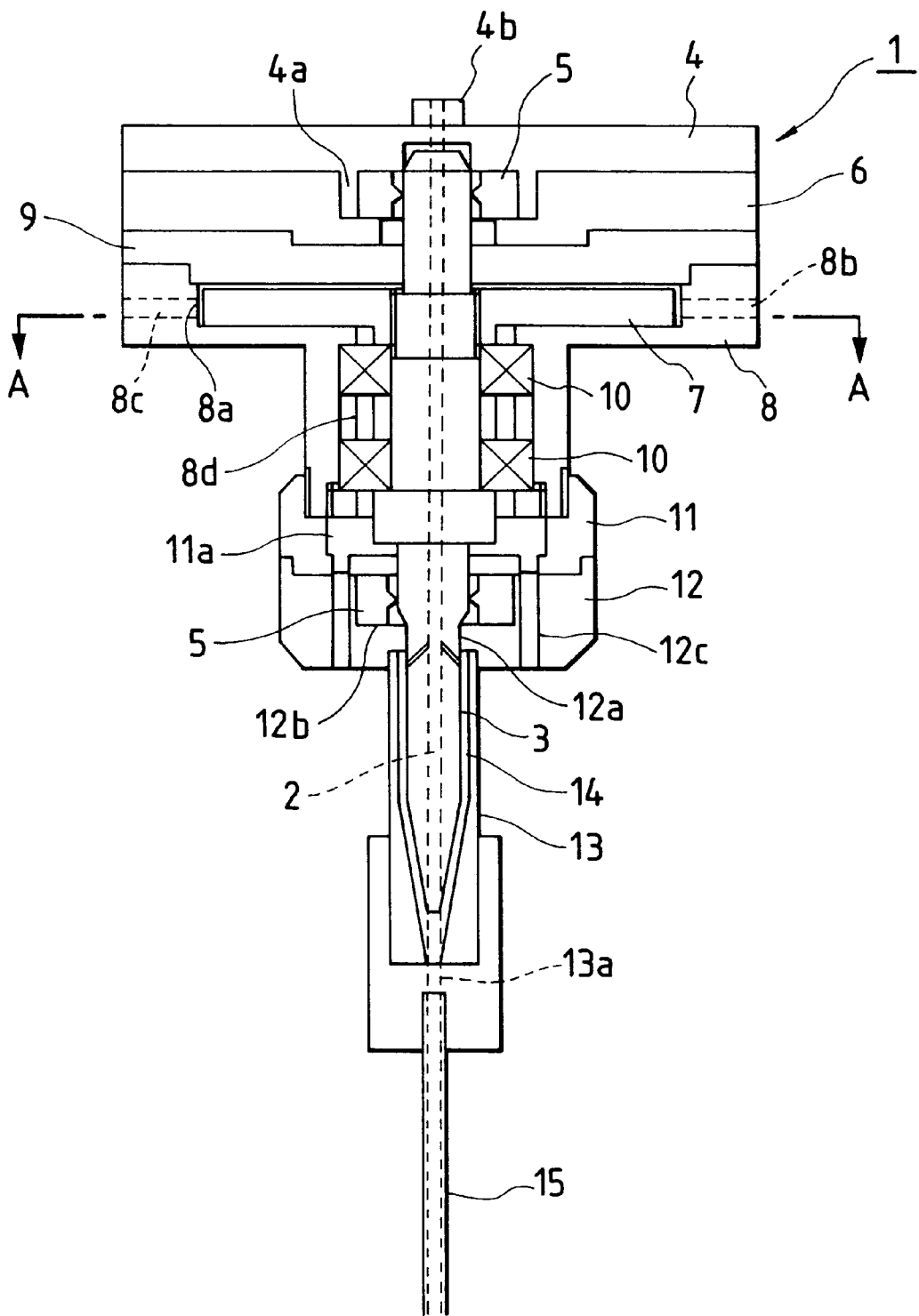
FIG. 1 is a cross-sectional view of the carrying apparatus of the present invention.
Figure 2:
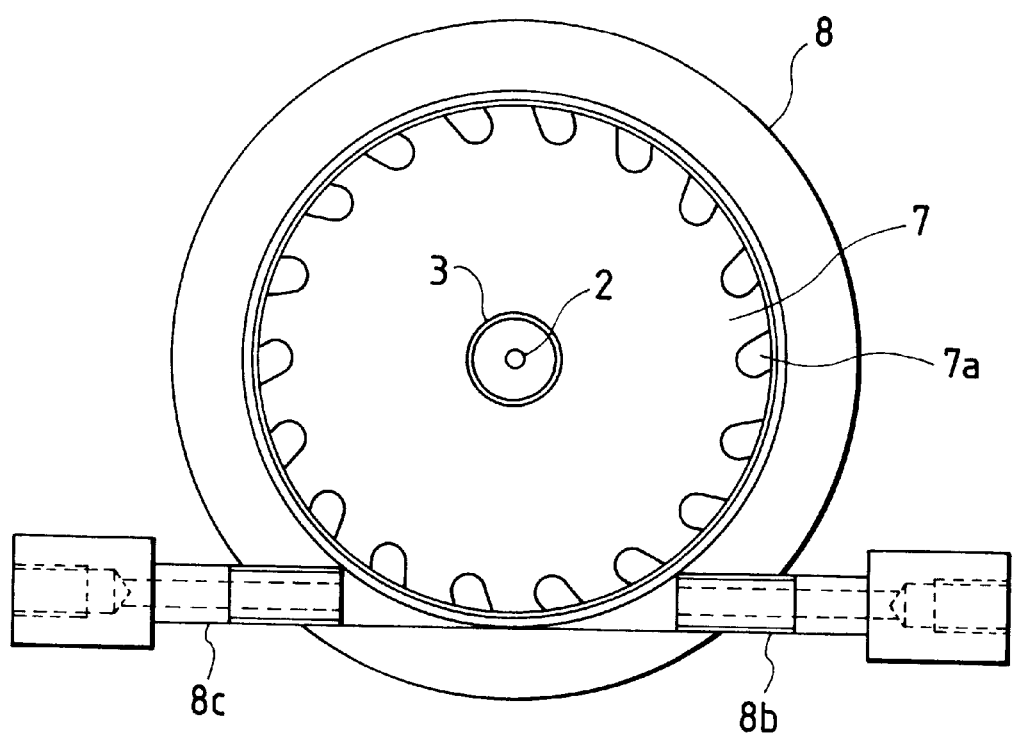
FIG. 2 is a cross-sectional view taken on line A—A in FIG. 1.
Figure 3:
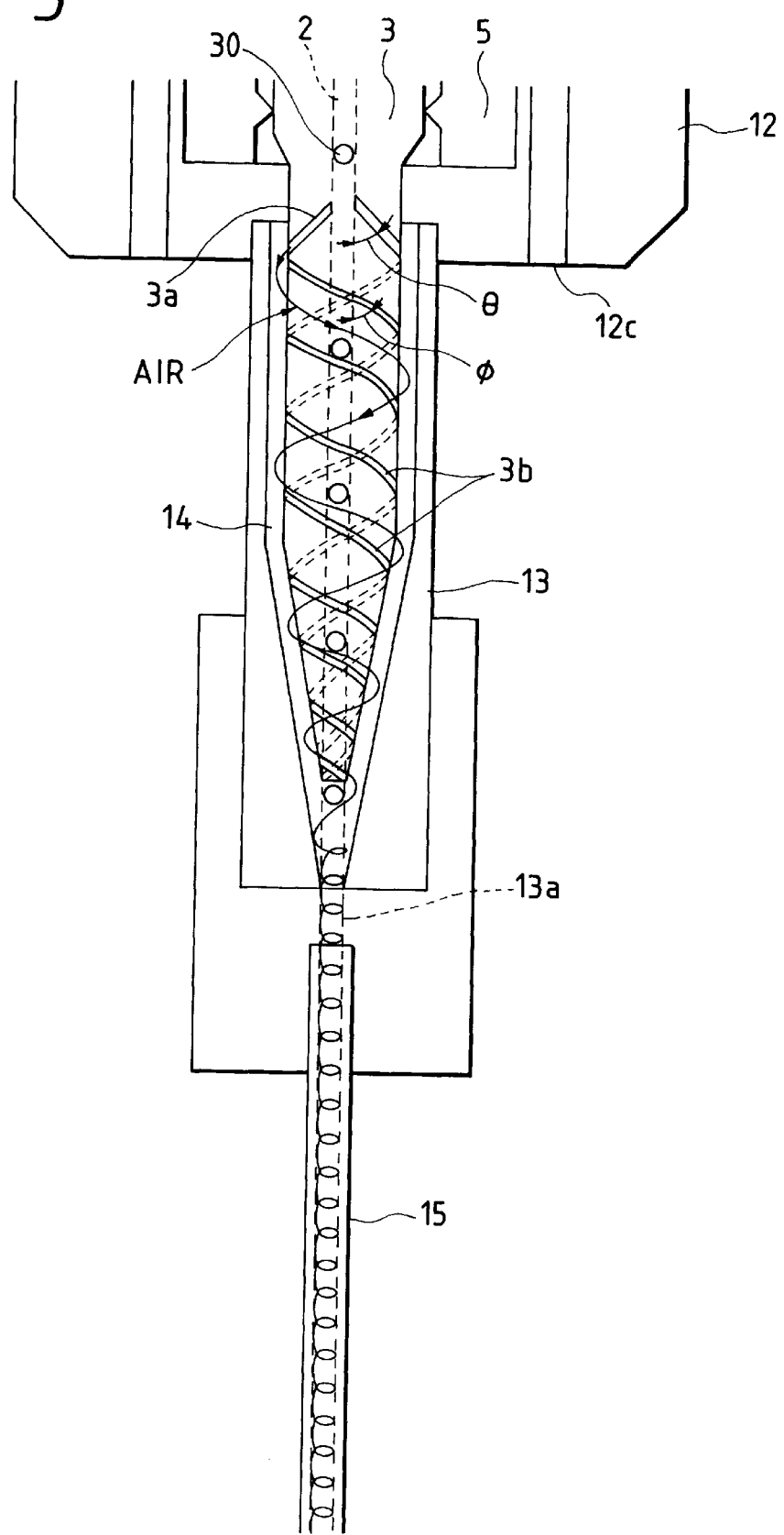
FIG. 3 is an enlarged view of the double pipe section shown in FIG. 1.

FIG. 1 is a cross-sectional view of the carrying apparatus 1 of the present invention. FIG. 2 is a cross-sectional view taken on line A—A in FIG. 1. FIG. 3 is an enlarged view of the double pipe section of FIG. 1.

As shown in FIG. 1, at the center of the carrying apparatus 1, there is provided a rotary shaft 3 capable of rotating freely, wherein a carrying passage 2, the section of which is circular, is formed in the rotary shaft 3 in the direction of the central axis. An upper end of the rotary shaft 3 is held by a central annular protruding portion 4a of a lid portion 4 via a seal 5.

At the center of the lid portion 4, there is formed a passage 4b communicating with the carrying passage 2. A spherical object carried from a before-process not shown is sent to the carrying passage 2 via the passage 4b. In this connection, the seal 5 is held by a seal holder 6 so as to prevent from being disconnected from the annular protruding portion 4a.

As the detail is shown in detail in FIG. 2, a rotor 7 driven by a gas, on the circumference of which a large number of receiving recesses 7a are formed, is fixed to a predetermined position in the upper portion of the rotary shaft 3. The rotor 7 is attached to the rotary shaft 3 so that the rotor 7 can be accommodated in the recess 8a formed in the upper end portion of the holder 8. On the side of the upper end portion of the holder 8, there are provided a gas inflow passage 8b and a gas discharge passage 8c through which the outer circumferential surface of the holder 8 and the recess 8a are communicated with each other, wherein these passages 8b, 8c are formed in the horizontal direction of the drawing. As can be seen in FIG. 2, these passages 8b, 8c are designed as follows. They are arranged on a straight line of a tangent of the rotor 7, and one end of each passage is open to a position opposed to the receiving recess 7a of the rotor 7. In this connection, as shown in FIG. 1, there is provided an intermediate lid 9 between the recess 8a of the holder 8 and the upper seal holder 6. The intermediate lid 9 holds the rotor 7 so that the rotor 7 can not be disengaged from the recess 8a.

At the center of the holder 8, there is provided an accommodating hole 8d which penetrates the holder 8 in the vertical direction. An intermediate portion of the rotary shaft 3 is rotatably accommodated in the accommodating hole 8d via a bearing 10. Accordingly, when a torque of the rotor 7 caused by injecting the gas into the accommodating hole 8d through the passage 8b is transmitted to the rotary shaft 3, the rotary shaft 3 starts rotating in the accommodating hole 8d. A small clearance is formed between the inner circumferential surface of the accommodating hole 8d and the rotary shaft 3. Therefore, a portion of gas fed from the gas inflow passage 8b is capable of flowing into the clearance.

A lower seal holder 12 is attached to the lower end of the holder 8 via an adapter 11. At the center of lower seal holder 12, there is formed a through-hole 12a. The rotary shaft 3 is inserted into the through-hole 12a, and a lower end portion of the rotary shaft 3 protrudes from the through-hole 12a. The periphery of the through-hole 12a is formed into a seal accommodating section 12b, in which a seal 5 is accommodated in the same manner as that of the upper seal holder 6. The seal members 5 provided in the upper seal holder 6 and the lower seal holder 12 positively hold the rotary shaft 3 and prevents gas, which has been fed from the gas inflow port 8b, from leaking out so that the rotary shaft 3 can be smoothly rotated. In this case, inert gas is preferably used as a gas for applying a rotation force.

On the other hand, in the adapter 11, there is provided a space which is a gas accommodating section 11a. The gas accommodating section 11a accommodates gas which has passed through a clearance between the rotary shaft 3 and the holder 8, and the gas is sent to a gas discharging hole 12c formed at a predetermined position in the lower seal holder 12. Accordingly, a portion of gas, which has been fed from the gas inflow passage 8b via the gas discharge hole 12c, is discharged in the apparatus shown in the drawing.

As shown in FIG. 1, a lower end portion of the rotary shaft 3 protruding from the lower seal holder 12 is formed into a cone, the forward end portion of which is tapering. One end of the carrying passage 2 is open to the forward end portion of the rotary shaft 3. In the periphery of the lower end portion of the rotary shaft 3, there is provided a double shaft 13 attached to the seal holder 12 in such a manner that the double shaft 13 surrounds the lower end portion of the rotary shaft 3. It is designed that a predetermined clearance 14 is formed between the outer circumferential surface of the rotary shaft 3 and the inner circumferential surface of the double tube 13.

As the detail is shown in FIG. 3, in a base portion of the protruding portion of the rotary shaft 3, there is provided a jet pipe 3a for jetting carrier fluid from the carrying passage 2 into the clearance 14. A diameter of the jet pipe 3a must be smaller than a diameter of the carrying passage 2 so that a spherical object 30 carried in the carrying passage 2 can not mistakenly enter the jet pipe 3a. In order to ensure a component of the carrying force to carry the spherical object to the carrying direction, it is necessary to arrange the jet pipe 3a in the direction from the carrying passage 2 to the outer circumferential surface of the rotary shaft 3 in such a manner that the jet pipe 3a is inclined to the carrying direction of the spherical object, that is, the jet pipe 3a is inclined downward in the case shown in the drawing. Although the inclination angle $\theta$ can be appropriately determined in accordance with an intensity of the required carrying force in this case, it is preferable that the inclination angle is at least not more than 45°, and it is more preferable that the inclination angle is not more than 30°. In this connection, it is preferable that the number of the jet pipes 3a is large. However, it is necessary that the number of the jet pipes 3a is at least not smaller than the number of spiral grooves described later.

In the example shown in FIG. 3, there are provided spiral grooves 3b on the outer circumferential surface of the rotary shaft 3 which is located in a portion lower than the openings of the jet pipes 3a. The spiral groove 3b transforms a straight current of carrier fluid, which has been jetted from the jet pipe 3a, into a spiral current of carrier fluid. The number of the spiral grooves 3b to be formed is not limited in particular, however, in order to obtain a spiral current of carrier fluid effectively, it is preferable that at least not less than two spiral grooves 3b are provided.

When intervals of the spiral grooves 3b are adjusted and also the inclination angle $\phi$ of each spiral groove with respect to the axis (carrying passage 2) is adjusted, it is possible to obtain currents of carrier fluid of various spiral types. That is, when the inclination angle $\phi$ of the spiral groove 3b is decreased, it becomes possible to obtain a spiral type current of carrier fluid of high speed. On the other hand, when the inclination angle $\phi$ of the spiral groove 3b is increased, it becomes possible to suppress a speed of the spiral type current of carrier fluid. When the intervals of the spiral grooves 3b are decreased, it is possible to generate a strong current of carrier fluid at the edge portion of the spiral type current of carrier fluid. On the other hand, when the intervals of the spiral grooves 3b are increased, it is possible to suppress an intensity of the spiral type current of carrier fluid. Accordingly, the number of the spiral grooves 3b, the inclination angle $\phi$ and the intervals of the spiral grooves are appropriately determined in accordance with the speed and intensity of the required spiral type current of carrier fluid. The interval of the spiral grooves 3b and the inclination angle may be constant along the rotary shaft 3, or alternatively the interval of the spiral grooves 3b and the inclination angle may be changed in the middle of the rotary shaft 3. In this connection, it is possible to obtain various types of spiral currents of carrier fluid by changing the number of revolutions of the rotary shaft 3 as well as the number of the spiral grooves 3b, the inclination angle $\phi$ and the interval of the spiral grooves.

It is preferable that the starting end of the spiral groove 3b is located at a position of the opening of the jet pipe 3a. Due to the above arrangement, carrier fluid jetted from the jet pipe 3a can be directly introduced into the spiral groove 3b. Therefore, the deflection of carrier fluid can be effectively conducted.

In this connection, instead of forming the spiral grooves 3b on the outer circumferential surface of the rotary shaft 3, spiral grooves may be formed on an inner circumferential surface of the double pipe 13. Due to the foregoing, it is unnecessary to form the spiral grooves 3b on the rotary shaft 3. When necessary, the spiral grooves may be formed on both the outer circumferential surface of the rotary shaft 3 and the inner circumferential surface of the double pipe 13.

As shown in FIG. 3, one end of the tube 15 is attached to the lower end portion of the double pipe 13. It is possible for the tube 15 to receive a spherical object discharged from the forward end of the rotary shaft 3 via the communicating passage 13a formed in the lower middle portion of the double pipe 13.

In the example shown in FIG. 3, the inner surface of the double pipe 13 is formed into a cone, the lower end portion of which is tapered, in accordance with the shape of the forward end portion of the rotary shaft 3. Accordingly, after the spiral type current of carrier gas has been deflected by the spiral grooves 3b, it is converged along the inner surface of the double pipe 13 and introduced into the tube 15. Accordingly, it is possible to introduce a spiral type current of carrier gas, the speed and intensity of which are sufficiently high, into the tube 15. Therefore, the spiral current of carrier gas can be maintained even in the tube 15.

The manufacturing process of the semiconductor device in which the above carrying apparatus is used will be explained as follows.

First, gas of a predetermined pressure and flow rate is fed to the rotor 7 located in the recess 8a in the holder 8 from the gas feeding device not shown in the drawing via the gas inflow passage 8b. Then, when gas is caught by the receiving recesses 7a of the rotor 7, the rotor 7 starts rotating. Rotation of the rotor 7 can be adjusted when pressure or flow rate of gas fed from the gas inflow passage 8b is adjusted. Usually, the rotating speed is set at 1000 to 120000 rpm. Usually, the pref gas is set at 0.5 to 6 kg/cm² for practical use. When the shape and number of the receiving recesses 7a provided on the outer circumferential surface of the rotor 7 are adjusted, it is possible to change the rotation characteristic of the rotor 7. After the rotor 7 has been rotated, the major part of gas is released outside via the gas discharge passage 8c. However, a portion of gas is discharged outside from the gas discharge hole 12c formed at a predetermined position of the lower holder 12 via the clearance formed between the inner circumferential surface of the accommodating hole 8d and the rotary shaft 3. Gas flowing in the clearance formed between the inner circumferential surface of the accommodating hole 8d and the rotary shaft 3 effectively cools a portion close to the bearing 10.

After it has been made sure that the rotor 7 is rotating at a predetermined rotating speed, spherical objects such as spherical single crystal silicon, on the surface of which a silicon oxide film is formed, are fed, being carried by carrier fluid, into the carrying passage 2 formed in the rotary shaft 3 in the central axial direction. The spherical objects flows in the carrying passage 2 by the action of the current of carrier fluid and discharges from the forward end of the rotary shaft 3.

In this connection, as described before, at a predetermined position of the rotary shaft 3, there is provided a jet pipe 3a for jetting carrier fluid from the carrying passage 2 into the clearance 14. Since the rotary shaft 3 is rotated at high speed, a portion of carrier gas fed into the carrying passage 2 together with the spherical objects is jetted into the clearance 14 via the jet pipe 3a. At this time, in the example shown in the drawing, since the spiral grooves 3b are formed on the outer circumferential surface of the rotary shaft 3, a flowing direction of the portion of carrier gas, which has been jetted before, is deflected by the spiral groove 3b, so that the current of carrier gas is transformed into a spiral type current of carrier gas in the clearance 14. The spiral type current of carrier gas is converged along the inner surface of the double pipe 13 and introduced into the tube 15.

In this connection, it is possible to obtain various types of spiral currents of carrier fluid by changing the number of revolutions of the rotary shaft 3 as well as the number of the spiral grooves 3b, the inclination angle $\phi$ and the interval of the spiral grooves.

On the other hand, the spherical objects discharged from the forward end of the rotary shaft 3, which have passed in the carrying passage 2, have a sufficiently high intensity of kinetic energy which has been given by the action of the current of carrier fluid in the carrying passage 2. Accordingly, the spherical objects are introduced into the tube 15 together with the spiral type current of carrier fluid.

Since the spiral type current of carrier fluid is maintained in the tube 15, the center of the tube 15 in the axial direction is in a decompressed condition. Accordingly, the spherical objects introduced into the tube 15 is held at the center of the tube 15. Since a carrier fluid layer, the flowing speed of which is high, is formed close to the inner surface of the tube 15, the spherical objects are not contacted with the inner circumferential surface of the tube 15. While the uncontact condition of the spherical objects with the inner surface of the tube 15 is kept, the spherical objects are carried to the successive process.

When the above apparatus is used, the spherical single crystal silicon are carried in an uncontact condition, and the oxide film on the surface is not contacted with the pipe-shaped body. Accordingly, there is no possibility that the oxide film is peeled off. Also, there is no possibility that pin holes are formed on the surface.

Figure 4:
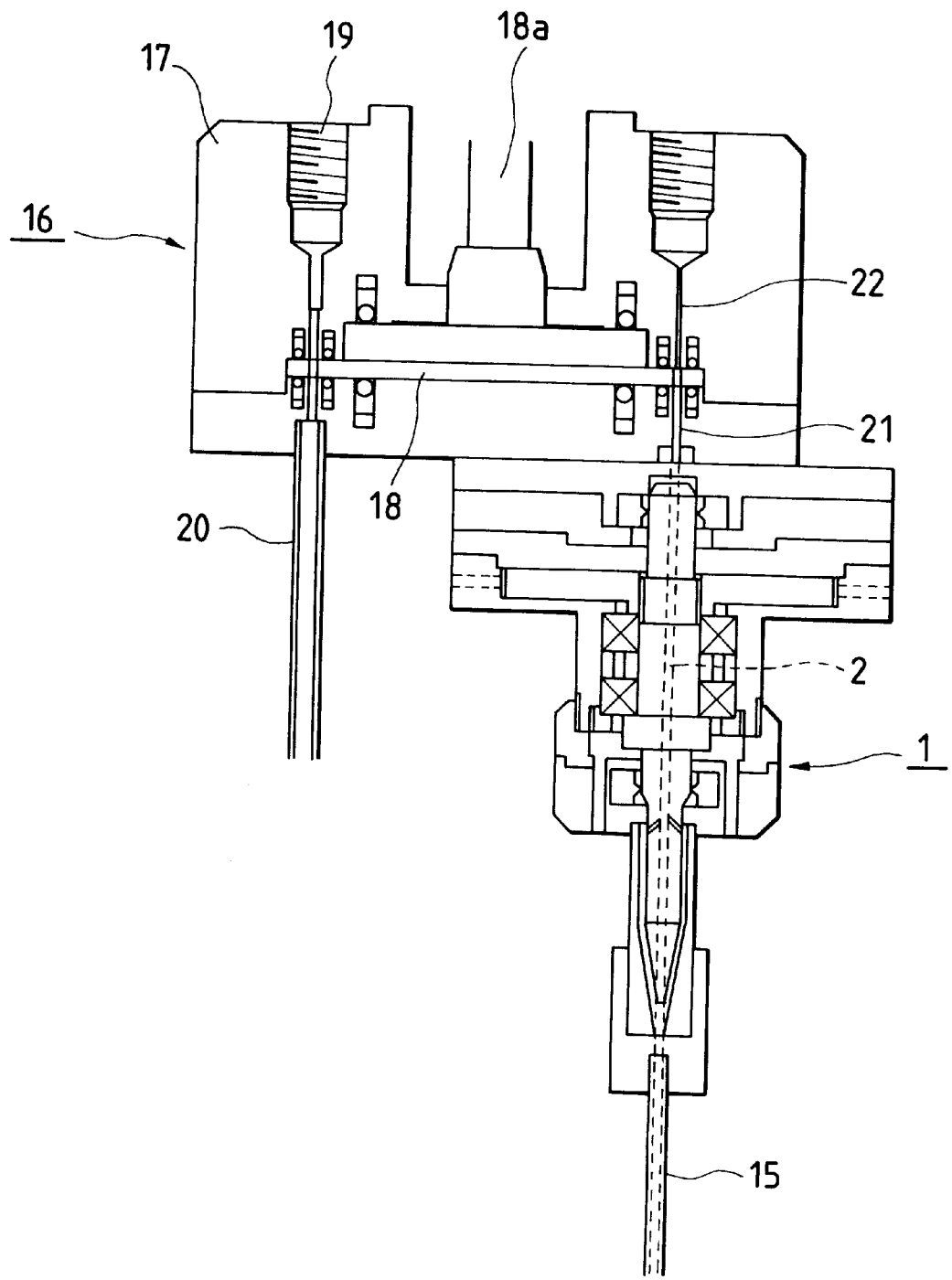
FIG. 4 is a cross-sectional schematic illustration showing a generation of a whirling current when the carrying apparatus of the present invention is used.

FIG. 4 is a cross-sectional view showing an example of the connection of the carrying apparatus 1 of the present invention with other apparatus.

Reference numeral 16 is a spherical object carrying apparatus. In this spherical object carrying apparatus, spherical semiconductor are accommodated in a plurality of accommodating chambers, the sectional shape of which is semicircular, which are formed along the outer circumferential surface of the rotary transfer device 18 accommodated in the container 17. The thus accommodated spherical semiconductors are sent to the successive process at regular intervals. The above spherical object carrying apparatus is the same as that disclosed in Japanese Patent Application No. 9-288724 applied by the present applicant. Therefore, the detailed explanation is omitted here.

The rotary transfer device 18 is rotated round the drive shaft 18a by a drive unit not shown in the drawing. A suction force generated by a suction unit not shown in the drawing acts on the inside of the receiving pipe 20 via the suction pipe 19 and the accommodating chamber of the rotary transfer device 18. Accordingly, the spherical objects such as single crystal silicon carried in the receiving pipe 20 from the before-process are introduced into the accommodating chamber of the rotary transfer device 18 by the suction force.

Next, when the rotary transfer device 18 is rotated round the drive shaft 18a, the spherical objects are moved along the circumference of the rotary transfer device 18 while they are held in the accommodating chamber. When the spherical objects are handled in this way, they can be periodically sent to the successive process at regular intervals.

When a position of the accommodating chamber coincides with a position of the opening of the pickup passage 21, carrier fluid of high pressure made of inert gas such as Ar fed from a fluid feeding device not shown in the drawing is jetted into the accommodating chamber via the discharge pipe 22. Therefore, the spherical objects are sent into the pickup passage 21 from the accommodating chamber by a jet force of the fluid.

The carrying passage 2 of the carrying apparatus 1 of the present invention is connected with the pickup passage 21 of the spherical object carrying apparatus 16 in this example shown in FIG. 4. Accordingly, the spherical objects such as spherical silicon sent from the pickup passage 21 are moved in the carrying passage 2 by the jet force of carrier fluid of high pressure and finally fed to the successive process not shown in the drawing via the tube 15. At this time, by the aforementioned action of the spiral type current of carrier fluid, the spherical objects are not contacted with the inner surface of the tube 15.

Figure 5:
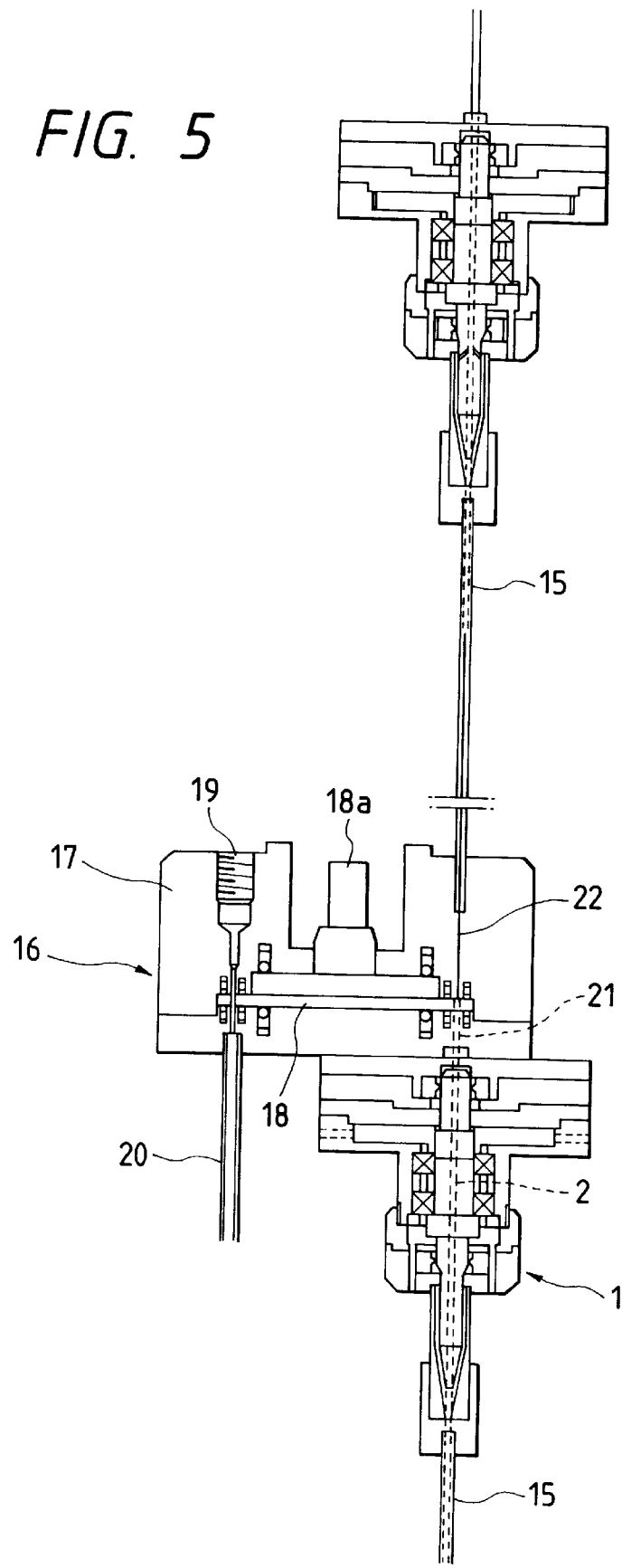
FIG. 5 is a cross-sectional schematic illustration showing an example of the use of the carrying apparatus 1 of the present invention.

FIG. 5 is a cross-sectional schematic illustration of an example of the carrying apparatus of the present invention. As shown in the drawing, a different point of the carrying apparatus shown in FIG. 5 from that shown in FIG. 4 is that the discharge pipe 22 is connected with the tube 15 of another carrying apparatus.

Accordingly, in the example shown in FIG. 5, argon gas, which is a carrier fluid of high pressure fed from the discharge pipe 22 into the accommodating chamber of the rotary transfer device 18, becomes a carrier fluid. Therefore, after the spherical objects have been discharged from the accommodating chamber, they are not contacted with the inner surface of the pickup passage 21 by the action of this carrier fluid.

In this apparatus, the spherical objects are carried as follows.

First, a spherical single crystal silicon, on the surface of which a silicon oxide film is formed, is carried in the receiving pipe 20 from the before-process. While the spherical single crystal silicon is being rotated in the accommodating chamber (not shown) of the rotary transfer device 18, the carrier atmosphere is converted. When the accommodating chamber has come to a position of the discharge pipe 22, the accommodating chamber is open to the discharge pipe 22, and a spiral type current of carrier gas (whirling current) of argon gas of high pressure is fed into the accommodating chamber of the rotary transfer device 18 from the discharge pipe 22 via the tube 15 of the uncontact carrying apparatus located in the upstream.

The spherical single crystal silicon is carried by this whirling current and sent to the carrying passage 2 of the uncontact carrying apparatus 1 without being contacted with the inner wall of the pickup passage 21.

Accordingly, in the same manner as that of the example shown in FIG. 4, the spherical single crystal silicon sent from the pickup passage 21 is moved in the carrying passage 2 by the jet force of the carrier fluid of high pressure and finally fed to the successive process not shown in the drawing via the tube 15.

At this time, by the action of the whirling current of two steps, the spherical single crystal silicon is not contacted with the inner surface of the tube 15. Therefore, the spherical single crystal silicon is carried and guided to the successive process without being damaged.

When the above carrying apparatus is used, MOS devices or solar batteries can be manufactured from spherical single crystal silicon by the combination of the carrying passages, rotary transfer device and carrier gas, which are enclosed in a closed space, without being exposed to the atmosphere.

For example, it is possible to make MOSFET in a closed space without being exposed to the atmosphere as follows. A spherical single crystal silicon is prepared and polished by a polishing device. The thus polished spherical single crystal silicon is formed into MOSFET by the rotary transfer device 18 and the carrying apparatus 1 shown in FIG. 5 only when gas, the temperature of which is controlled, is fed and discharged.

The process will be described below. The spherical single crystal silicon is cleaned. Then, a natural oxide film is removed from the surface. A gate insulating film is formed by thermal oxidation. A polycrystaline silicon layer is formed in CVD process. After that, by patterning the polycrystalline silicon layer in the photolithography process, a gate electrode of the patterned polycrystalline silicon layer is formed.

Then, after forming an interlayer insulating layer, a polycrystalline silicon film containing desired impurities is formed on the surface. And then by conducting a heat treatment, the impurity is diffused from the polycrystalline silicon film into the spherical single crystal silicon so as to form a source drain region and this polycrystalline silicon layer is used as a source/drain contact layer.

Finally, an electrode is formed on the source/drain contact layer. In this way, MOSFET can be very effectively formed in a closed space.

When the above carrying apparatus is used, it is possible to conduct a desired heat treatment by using a very small quantity of gas, and further it is possible to carry all spherical objects in an uncontact condition by using a whirling current. Accordingly, there is no possibility of occurrence of peeling and scratches. Therefore, it is possible to form a highly reliable semiconductor device while the yield is maintained high. As a carrier fluid, an inert gas is preferably used. In the above example, carrier gas is fed and discharged from carrying the spherical object, however, it is possible to apply the present invention to a apparatus in which liquid is used as a carrier fluid.

As a carrier fluid, a gas containing a reduction gas such as hydrogen gas or halogen gas is also applicable.

The present invention can provide the following effects.

(1) When a spherical object such as a spherical semiconductor is carried in a pipe-shaped body, it is possible to avoid a contact of the spherical object with an inner surface of the passage. Therefore, a surface of the spherical object can be prevented from wearing out, and occurrence of small scratches can be prevented. Especially when the spherical object is a spherical single crystal silicon, it is possible to maintain the quality of spherical IC.

(2) When the rotating speed of the rotary shaft, and the number and shape of spiral grooves formed on the outer circumferential surface of the rotary shaft are controlled, it is possible to freely form various types of spiral currents.

(3) It is unnecessary to conduct a special treatment on the inner surface of the pipe-shaped body for protecting the spherical object.

What is claimed is:

1. An apparatus for carrying spherical objects comprising:
   a carrying passage in which spherical objects are made to pass through; and
   a whirling current generator that generates a spiral current of fluid in the carrying passage,
   wherein the spiral current generator includes:
      a rotary shaft in which a carrying passage is formed in a direction of the central axis thereof and a spiral groove is formed on the outer circumferential surface;
      a jet pipe formed in the rotary shaft, the jet pipe connecting the carrying passage with the spiral groove, and
      an outer pipe surrounding at least a part of said rotary shaft and extending to the lower current side than an end of the rotary shaft so as to form a spiral passage between said outer pipe and the spiral groove,
      wherein by supplying spherical objects accompanied with carrier gas from upper current side of the carrying passage, a part of the carrier gas is passed through the jet pipe, the spiral passage to form a whirling current and the spherical objects are transferred out of the end of the outer pipe with the whirling current.

2. The apparatus for carrying spherical objects according to claim 1, wherein
   the rotary shaft has a straight portion whose outer diameter is constant, and tapered portion whose outer diameter is gradually contracted.

3. The apparatus for carrying spherical objects according to claim 1, further comprising:
   a rotary transfer device in which a plurality of spherical object accommodating chambers are formed at regular intervals; and
   a supporting device for supporting the rotary transfer device, the supporting device having a receiving passage for receiving the spherical object which communicates with the accommodating chamber and also having a pickup passage, wherein the carrying passage is connected with the pickup passage for picking up the spherical object.

4. The apparatus for carrying spherical objects according to claim 1, wherein the spherical object is a spherical single crystal silicon.

5. The apparatus for carrying spherical objects according to claim 1, wherein the spherical object is a spherical single crystal silicon covered with a gate oxide film.

6. The apparatus for carrying spherical objects according to claim 1, wherein the carrier gas is an inert gas.

7. The apparatus for carrying spherical objects according to claim 1, wherein an inner diameter of the jet pipe is smaller than the outer diameter of the spherical object.

8. The apparatus for carrying spherical objects according to claim 1, further comprising:
   a rotor attached to the rotary shaft, and provided that a plurality of receiving recesses on an outer circumferential surface so that the rotor is driven by feeding a fluid to the receiving recesses.

9. The apparatus for carrying spherical objects according to claim 8, further comprising:
   a rotation controller that controls the rotating speed of the rotary shaft by controlling a quantity of fluid fed to the receiving recesses.

10. The apparatus for carrying spherical objects according to claim 1, wherein
   the jet pipe is formed in a direction making an acute angle with the central axis.

11. The apparatus for carrying spherical objects according to claim 10, wherein
   the angle $\theta$ is not more than 45°.

12. The apparatus for carrying spherical objects according to claim 10, wherein
   the angle $\theta$ is not more than 30°.

* * * * *